(12) United States Patent
Komatsu (10) Patent No.: US 7,464,312 B2
(45) Date of Patent: Dec. 9, 2008

(54) SHIFT REGISTER, SCANNING LINE DRIVING CIRCUIT, MATRIX TYPE DEVICE, ELECTRO-OPTIC DEVICE, AND ELECTRONIC DEVICE

(75) Inventor: Yuko Komatsu, Suwa (JP)

(73) Assignee: Seiko Epson Corporation (JP)

( * ) Notice: Subject to any disclaimer, the term of this patent is extended or adjusted under 35 U.S.C. 154(b) by 318 days.

(21) Appl. No.: 11/463,115

(22) Filed: Aug. 8, 2006

(65) Prior Publication Data
US 2007/0061648 A1    Mar. 15, 2007

(30) Foreign Application Priority Data
Aug. 23, 2005  (JP) .............. 2005-241508

(51) Int. Cl.
*G01R 31/28* (2006.01)
*G01R 17/02* (2006.01)
*G01R 17/06* (2006.01)

(52) U.S. Cl. .............. 714/731; 345/98; 345/99
(58) Field of Classification Search ............ None
See application file for complete search history.

(56) References Cited
U.S. PATENT DOCUMENTS 6,894,674 B2 * 5/2005 Nakajima et al. ......... 345/100

7,245,281 B2 * 7/2007 Sekido et al. ............. 345/87
7,248,243 B2 * 7/2007 Murakami et al. .......... 345/98
7,284,170 B2 * 10/2007 Whetsel .................. 714/724

FOREIGN PATENT DOCUMENTS

| JP | 11-134893 | 5/1999 |
| JP | 2004-127509 | 4/2004 |
| JP | 2005-134194 | 5/2005 |

* cited by examiner

*Primary Examiner*—Christine T Tu
(74) *Attorney, Agent, or Firm*—Harness, Dickey & Pierce, P.L.C.

(57) ABSTRACT

The invention provides a shifter register comprising: a plurality of shift circuit blocks connected in series, each of which includes a predetermined even-number of shift unit circuits; a plurality of clock decision circuit, each of which is provided for each of a plurality of the shift circuit blocks and receives internal condition signals from even-numbered shift unit circuits included in a corresponding shift circuit block and an internal condition signal from the last shift unit circuit included in a preceding shift circuit block, each of the clock decision circuit outputting an operation allowance signal when at least one of the internal condition signals has a first level; and a plurality of clock control circuits, each of which is provided for each of a plurality of the shift circuit blocks and performs a clock signal output operation when the operation allowance signal is supplied from a corresponding clock decision circuit commonly connected to another shift circuit block.

7 Claims, 11 Drawing Sheets

SHIFT REGISTER, SCANNING LINE DRIVING CIRCUIT, MATRIX TYPE DEVICE, ELECTRO-OPTIC DEVICE, AND ELECTRONIC DEVICE

BACKGROUND

1. Technical Field

The present invention relates to a shift register circuit, a method of controlling a shift register, and a scanning line driving circuit, an active matrix apparatus, and an electronic device using the same.

2. Related Art

A JP-A-11-134893 (hereinafter, referred to as a patent document 1) discloses a shift register that has a clock control means corresponding to each stage of a shift unit circuit and is constructed such that a clock signal is supplied to the shift unit circuit only when a corresponding shift unit circuit is activated by this clock control means. According to this construction, it is possible to reduce power consumption. In the shift register disclosed in the patent document 1, one clock control means is provided for one stage of the shift register, and a clock control circuit has the same pitch as that of the shift register. This type of shift register is used as a driving circuit of a matrix type liquid crystal display device.

Recently, a display device is developed to have a higher precision. However, in order to provide a display area (a pixel area) having a higher precision according to necessity in a related art, the pitch of the shift register should be reduced accordingly. Therefore, a wiring arrangement of a corresponding clock control circuit should be changed according to the reduced pitch of the shift register. Generally, the clock control circuit is constructed of several tens of transistors, and has a complicated circuit arrangement. Although it is preferable for a display unit of a liquid crystal display panel mounted on a mobile phone and the like to have a narrow frame, the entire width of a driver circuit may be enlarged if a layout of the clock control circuit is designed based on a narrower pitch of a shift register. As a result, the frame of a display device may be enlarged accordingly.

In order to solve such a problem, a JP-A-2004-127509 (hereinafter, referred to as a patent document 2) discloses a shift register circuit, in which shift registers are divided into N circuit blocks along a length of stages, a clock control circuit is provided for each divided circuit block, and a predetermined number of the clock control circuits are controlled based on output signals from the latch circuits provided in the preceding and following stages of the corresponding circuit block. The shift register disclosed in the patent document 2 is advantageous in that the circuit size can be minimized and power consumption can be reduced, but also has shortcomings as follows.

Firstly, it is assumed that a series of pulses are transmitted to a certain circuit block. In this case, when the pulse signal is transmitted to the last stage of the (N−1)th circuit block, the clock control circuit of the Nth stage is activated by detecting the output signal from the last stage of the (N−1)th circuit block, and the clock signal is supplied to the Nth circuit block. When a head pulse is transmitted to the latch circuit provided in the second stage of the Nth circuit block, and its output signal is activated, a reset signal is supplied to the clock control circuit of the (N−1)th stage, and the clock signal supplied to the (N−1)th circuit block stops. In other words, the second and subsequent pulses are not transmitted to the Nth stage, and the pulse signal stays in the (N−1)th circuit block. Although such a problem may not occur if one pulse is transmitted per one time, the shift register disclosed in the patent document 2 cannot satisfy various kinds of requirements for the driving method that are being recently used. For example, if it is required that a plurality of pulses should be simultaneously transmitted to one circuit block, the shift register disclosed in the patent document 2 cannot satisfy this requirement.

SUMMARY

Accordingly, it is an object of the present invention to provide a shift register capable of satisfying requirements for reducing a circuit size or power consumption and supplying a clock signal after the shift circuit to which data should be transmitted is accurately determined regardless of the timing or the number of the transmitted data.

According to an aspect of the present invention, there is provided a shifter register comprising: a plurality of shift circuit blocks connected in series, each of which includes a predetermined even-number of shift unit circuits; a plurality of clock decision circuit, each of which is provided for each of a plurality of the shift circuit blocks and receives internal condition signals from even-numbered shift unit circuits included in a corresponding shift circuit block and an internal condition signal from the last shift unit circuit included in a preceding shift circuit block, each of the clock decision circuit outputting an operation allowance signal when at least one of the internal condition signals has a first level; and a plurality of clock control circuits, each of which is provided for each of a plurality of the shift circuit blocks and performs a clock signal output operation when the operation allowance signal is supplied from a corresponding clock decision circuit commonly connected to another shift circuit block. According to this construction, it is possible to reduce the number of the clock control circuits in comparison with a case that a signal clock control circuit is provided for each shift unit circuit. Accordingly, it is possible to reduce a circuit size and power consumption. As a result, a circuit layout having a narrow pitch can be implemented, and it is possible to apply the clock control circuit to a high precision liquid crystal panel. Also, it is possible to accurately determine a shift circuit block to which the data should be transmitted and supply a clock signal regardless of the timing or the number of the transmission data. Therefore, even an input signal successively alternating between high and low levels can be transmitted, and the shift register can operate in a similar way to the conventional shift register.

Preferably, the clock decision circuit may be a multi-input NAND gate, an output signal from the shift unit circuit may be inverted, and the inverted output signal may be input to the clock decision circuit as the internal condition signal. In addition, the clock decision circuit may be a multi-input NOR gate, and the output signal from the shift unit circuit may be input as the internal condition signal.

According to this construction, since the clock control circuit can be constructed of a single multi-input gate, it is possible to simplify a circuit layout. In addition, since a clock decision circuit is constructed of a single stage of gates, and a response after the condition of the shift unit circuit is changed until the first signal (i.e., a clock decision signal) is supplied is rapid, it is possible to supply a waveform of the resultant clock signal having little rounding or delay.

According to another embodiment of the present invention, there is provided a scanning line driving circuit having the aforementioned shift register. As a result, it is possible to obtain a high quality shift register.

According to still another embodiment of the present invention, there are provided a matrix type device having the aforementioned scanning line driving circuit and an electro-optic device having the aforementioned matrix type device. Herein, the matrix type device refers to a general device which has a scanning line driving circuit and a data line driving circuit and allows functional elements arranged in a matrix shape to be selected in a predetermined order to provide a predetermined function. Such a matrix type device may be used in various devices including electro-optic devices such as an electrophoresis display device, a liquid crystal display device, and an electroluminescent display device, or an electrostatic capacity detection device such as a fingerprint recognition sensor. As a result, it is possible to obtain a high quality matrix type device and a high quality electro-optic device.

According to still further another embodiment of the present invention, there is provided an electronic device having the electro-optic device in a display unit. Herein, the electronic device refers to a general device that can electronically provide a predetermined function. The electronic device may include an electronic paper, an electronic note, a mobile phone, a video camera, a personal computer, a digital camera, a PDA, and an electronic book, but not limited thereto.

BRIEF DESCRIPTION OF THE DRAWINGS

The invention will be described with reference to the accompanying drawings, wherein like numbers reference like elements.

DESCRIPTION OF EXEMPLARY EMBODIMENTS

The embodiments of the present embodiment will now be described with reference to the accompanying drawings. Hereinafter, an electrophoresis display device will be explained as an active matrix type device according to the present invention. It should be noted that an overbar is labeled over their symbols to represent an inverted signals in the drawings while a slash "/" is added to the head of their symbols to represent an inverted signal in the specification for convenient descriptions.

Figure 1:
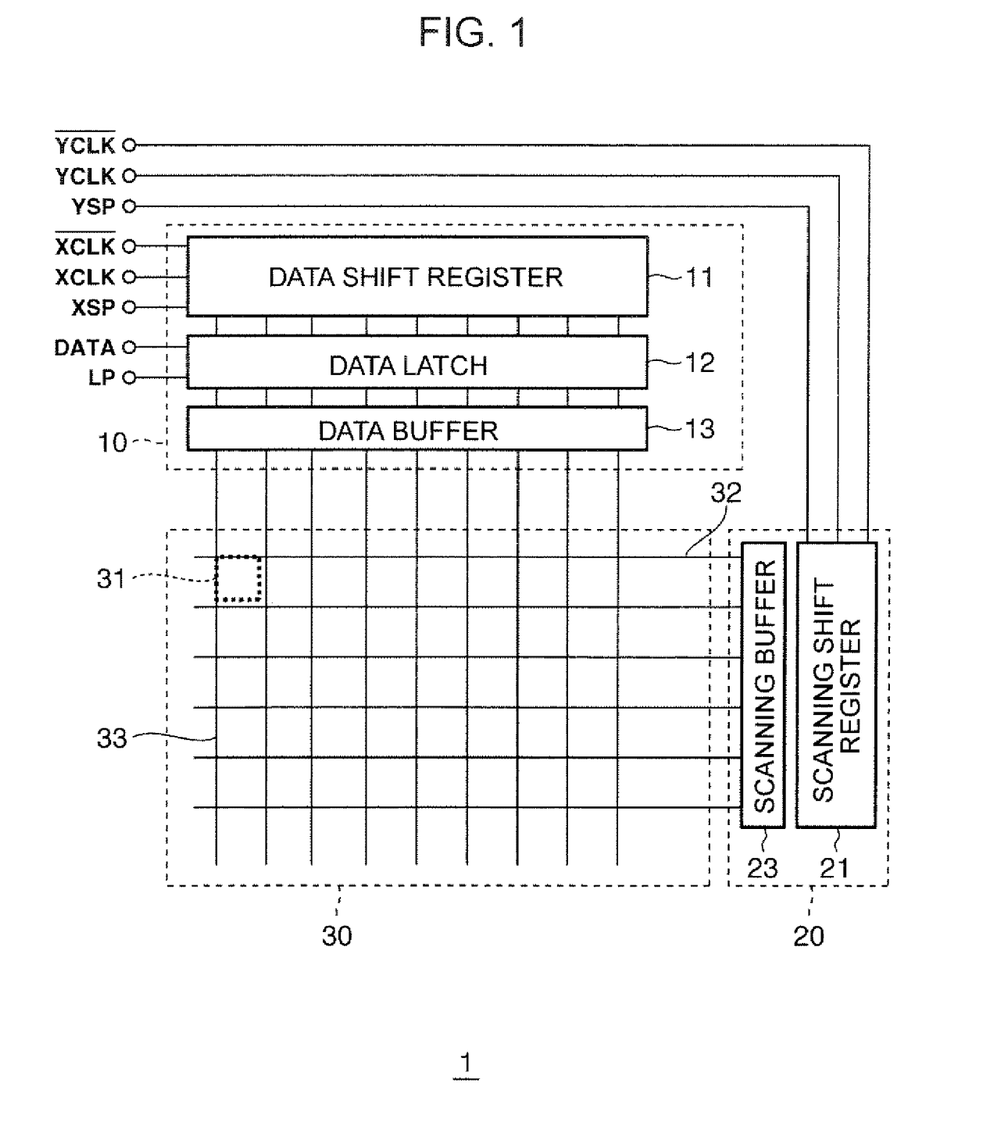
FIG. 1 is a block diagram illustrating an electrophoresis display device according to an embodiment of the present invention.

FIG. 1 is a block diagram illustrating an electrophoresis display device according to an embodiment of the present invention. The electrophoresis display device shown in FIG. 1 includes: M scanning lines 32; a scanning driver 20 (i.e., a scanning line driving circuit) for selecting the scanning lines 32 in a predetermined order; N data lines 33 crossed with the scanning lines 32; a data driver 10 (i.e., a data line driving circuit) for selecting the data lines 33 in a predetermined order; and an active matrix unit 30 having a plurality of pixel circuits 31 provided in each intersection between each scanning line 32 and each data line 33 in a matrix shape. The pixel circuit 31 includes an electrophoresis element and circuit elements such as a transistor for controlling the electrophoresis element. The data driver 10 includes: a data latch 12; a data shift register 11 for selecting the data latch 12 in a predetermined order; and a data buffer 13. The scanning driver 20 includes a scanning shift register 21 for scanning the scanning lines 32 in a predetermined order and a scanning buffer 23.

Figure 2:
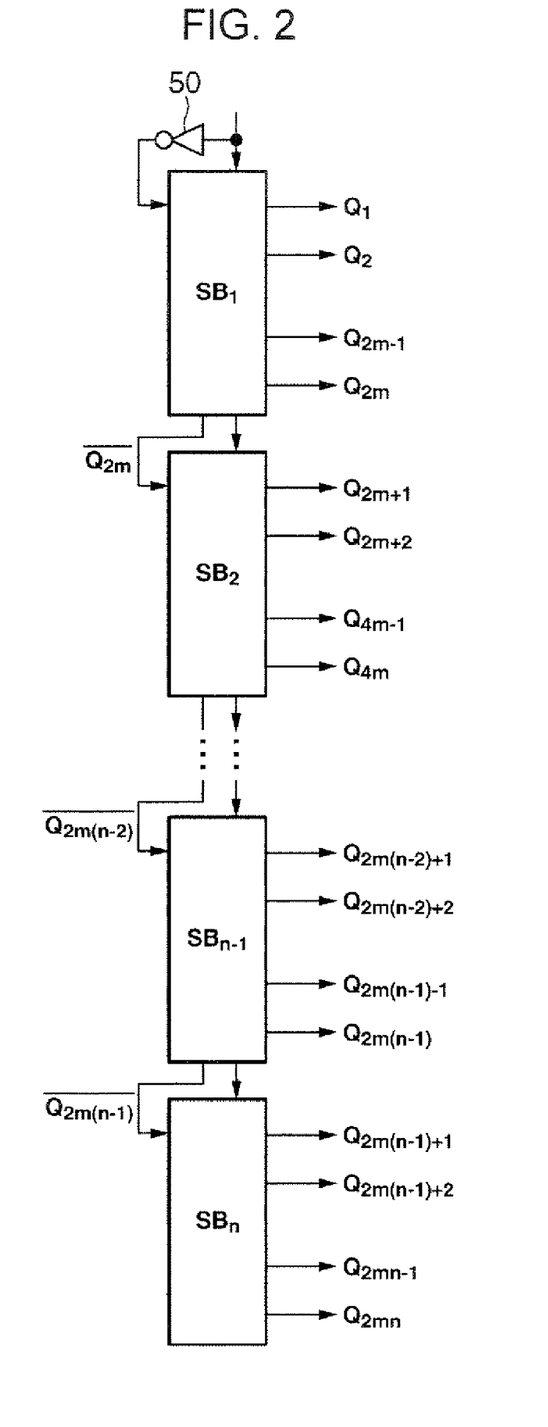
FIG. 2 is a block diagram illustrating a scanning shift register according to an embodiment of the present invention.

FIG. 2 is a block diagram illustrating a scanning shift register 21. Referring to FIG. 2, the scanning shift register 21 includes a plurality of shift circuit blocks SB1 to SBn (where n is any natural number). Each shift circuit block SB1 to SBn includes a predetermined even number of shift unit circuits. A clock control circuit and a clock decision circuit are provided for each shift circuit block. The shift circuit blocks SB1 to SBn are interconnected in series as shown in FIG. 2. The first shift circuit block SB1 receives a start pulse SP(YSP) and its inverted signal /SP inverted by an inverter 50.

Figure 3:
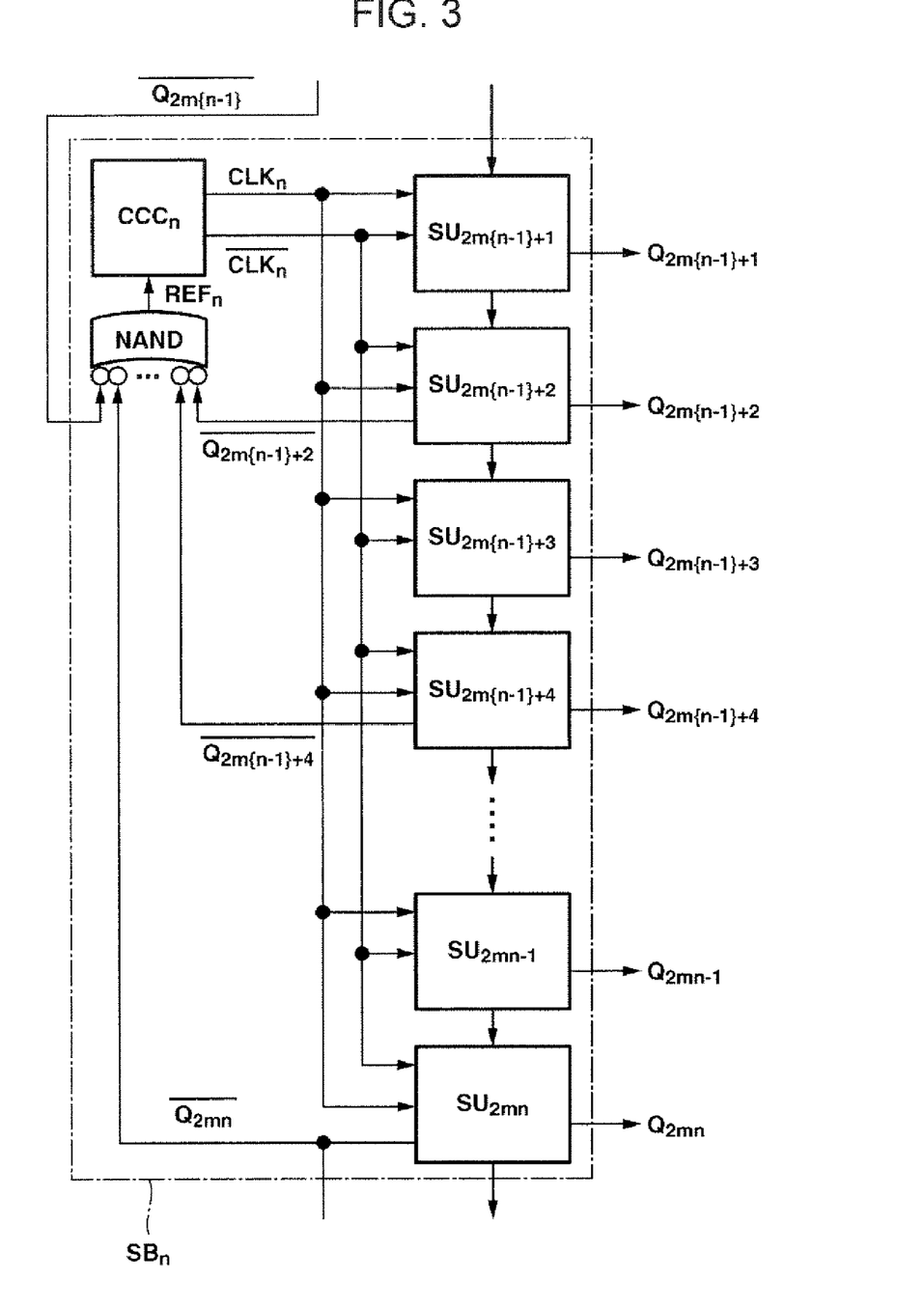
FIG. 3 is a block diagram illustrating each shift circuit block according to an embodiment of the present invention.

FIG. 3 is a block diagram illustrating each shift circuit block in detail. Although a single shift circuit block SBn is shown as an example in FIG. 3, other shift circuit blocks may have a similar construction. Referring to FIG. 3, the shift circuit block SBn includes a single clock control circuit CCCn; a multi-input NAND gate NAND functioning as a clock decision circuit; and shift unit circuits $SU_{2m[n-1]+1}$ to $SU_{2mn}$.

The clock control circuit CCCn controls the clock signal supplied to each shift unit circuit by referring to the output signal REFn from the multi-input NAND gate NAND. Specifically, one clock control circuit CCCn is prepared for each shift circuit block. A clock signal output operation is performed when a predetermined allowance signal is supplied from the multi-input NAND gate NAND commonly connected to another shift circuit block.

The multi-input NAND gate NAND receives internal condition signals from even-numbered shift unit circuits included in the shift circuit block SBn corresponding to itself and an internal condition signal from the shift unit circuit included in the last stage of the preceding shift circuit block SB(n−1). When one of these internal condition signals is at a first level (e.g., a low level), an output signal REFn (i.e., an operation allowance signal) having a high level is output. In other words, the multi-input NAND gate NAND functions as a decision circuit for determining whether or not the clock signal should be supplied. In FIG. 3, the multi-input NAND gate NAND receives internal condition signals $/Q_{2m[n-1]+2}$, $/Q_{2m[n-1]+4}$, ... $/Q_{2mn}$ of even-numbered shift unit circuits SU included in the shift circuit block SBn and an internal condition signal $/Q_{2mn}$ of the shift unit circuit $SU_{2mn}$ included in the last stage of the preceding circuit block SBn−1. If any internal condition signal has a low level, the output signal REFn of the multi-input NAND gate NAND is turned to a high level. At this moment, the clock control circuit CCCn is operated to supply a clock signal CLKn and an inverted clock signal /CLKn to each shift unit circuit of the corresponding shift circuit block SBn. In addition, when all of the internal condition signals input to the multi-input NAND gate NAND from each shift unit circuit have a high level, the output signal REFn of the multi-input NAND gate NAND is turned to a lower level. At this moment, the clock control circuit CCCn stops supplying the clock signal CLKn and the inverted clock signal /CLKn to each shift unit circuit included in the corresponding shift circuit block SBn.

In addition, the number of the shift unit circuits included in each shift circuit block SBn can be arbitrarily selected if it is an even number. For example, two or four shift unit circuits may be preferably provided.

Figure 4:
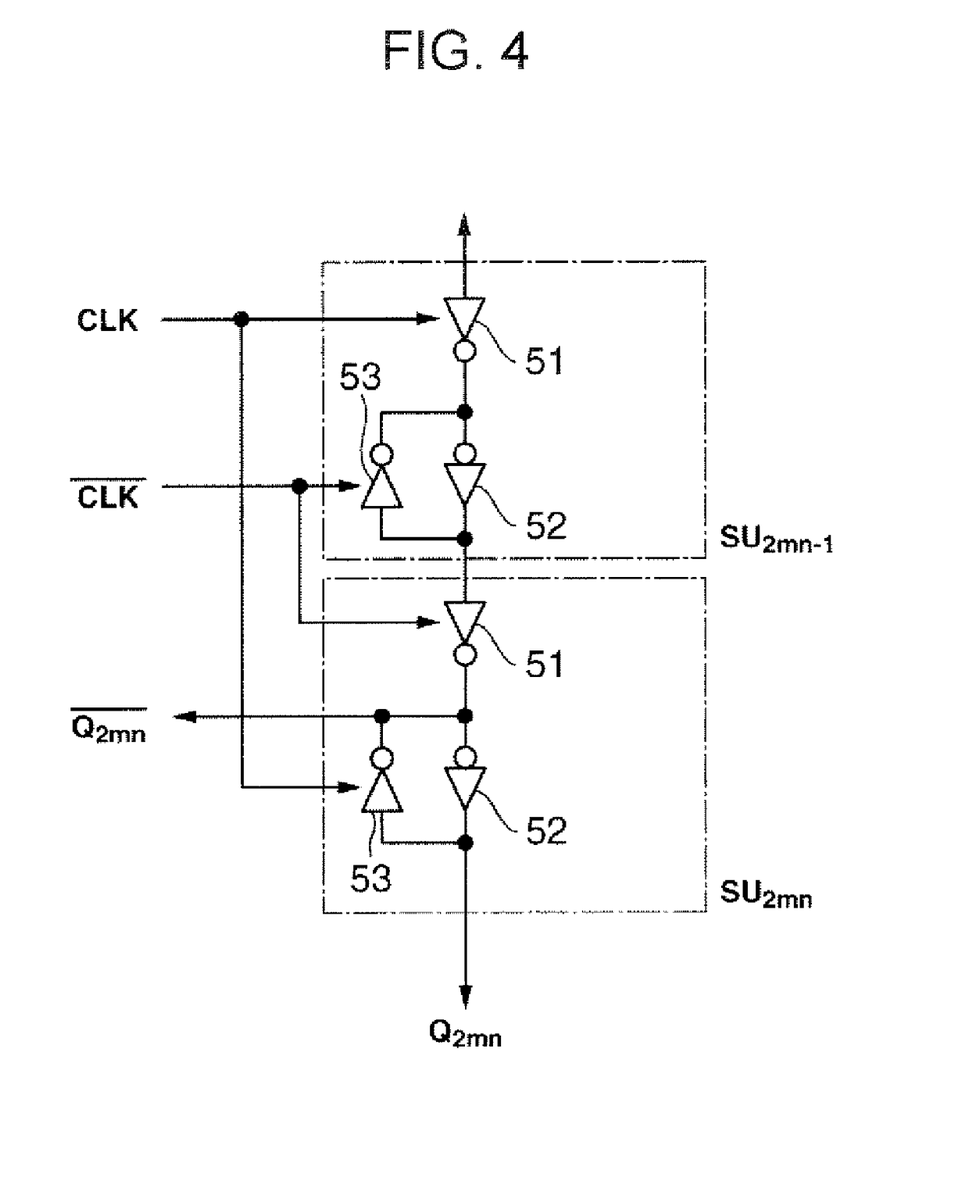
FIG. 4 is a circuit diagram illustrating a shift unit circuit according an embodiment of the present invention.

FIG. 4 is a circuit diagram illustrating a shift unit circuit according to an embodiment of the present invention. Referring to FIG. 4, each shift unit circuit $SU_{2mn-1}$, and $SU_{2mn}$ includes a clocked inverter 51; an inverter 52; and a feedback clocked inverter 53 which inverts the output signal from the inverter 52 and supplies the inverted output signal to a node between the clocked inverter 51 and the inverter 52 in a feedback manner. In the odd-numbered shift unit circuit $SU_{2mn-1}$, the clocked inverter 51 receives the clock signal CLK, and the clocked inverter 53 receives the inverted clock signal /CLK. In the even-numbered shift unit circuit $SU_{2mn}$, the clocked inverter 51 receives the inverted clock signal /CLK, and the clocked inverter 53 receives the clock signal CLK. In this embodiment, the inverted output signal /Q obtained by inverting the output signal Q from the shift unit circuit is supplied from a node between the output terminal of the clocked inverter 51 included in the even-numbered shift unit circuit and the input terminal of the inverter 52 to the multi-input NAND gate NAND.

Figure 5:
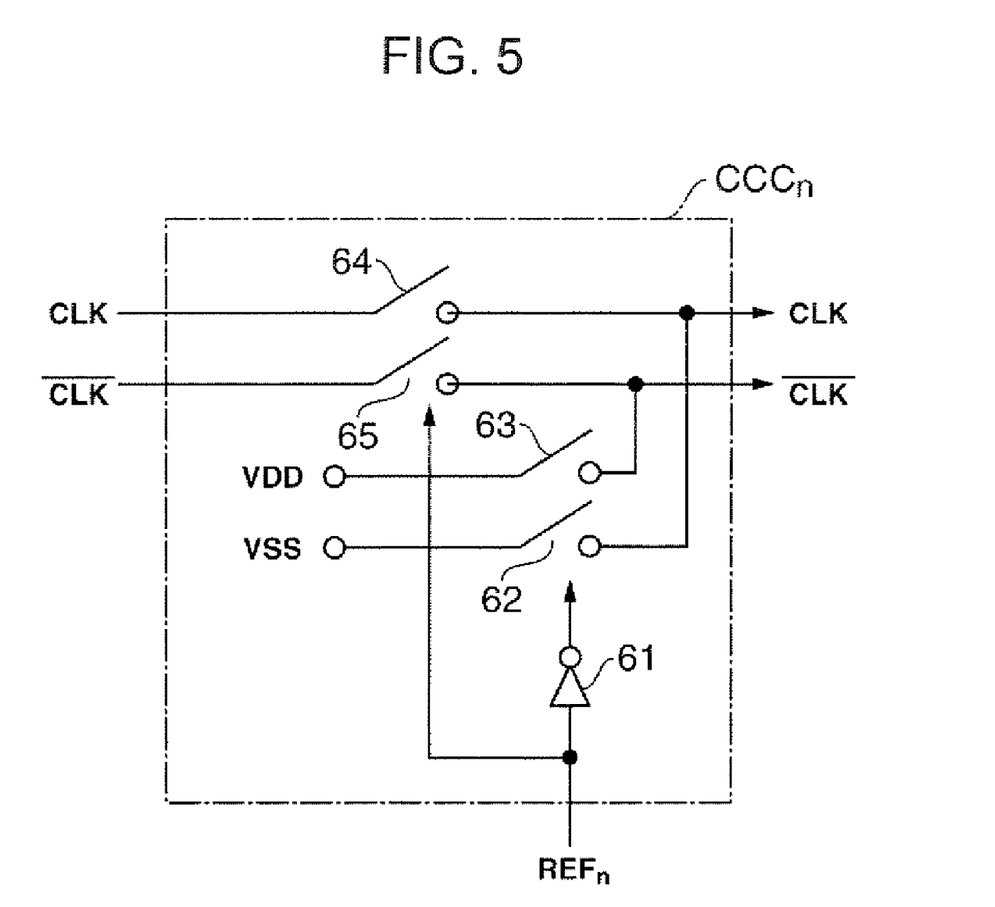
FIG. 5 is a circuit diagram illustrating a clock control circuit according to an embodiment of the present invention.

FIG. 5 is a circuit diagram for describing a clock control circuit according to an embodiment of the present invention. Referring to FIG. 5, the clock control circuit CCCn includes an inverter 61 and switching elements 62 to 65. The inverter 61 receives an output signal REFn from the multi-input NAND gate NAND. Each switching element 62 and 63 is constructed of a circuit element such as a transistor, and opened/closed based on the output signal /REFn from the inverter 61. A high power voltage VDD is supplied to a terminal of the switching element 62, and a low power voltage VSS is supplied to a terminal of the switching element 63. When each switching element 62 and 63 is closed, the high and low power voltages VDD and VSS are output therefrom. In other words, the clock signal CLK having a similar level to that of the high power voltage VDD and the inverted clock signal /CLK having a similar level to that of the low power voltage VSS are supplied to each shift unit circuit. Each switching circuit 64 and 65 is constructed of a circuit element such as a transistor, and opened/closed based on the output signal REFn from the multi-input NAND gate NAND. In other words, this pair of switching elements 64 and 65 are reversely operated with respect to the other pair of switching elements 62 and 63 (i.e., a pair of switching elements 64 and 65 are opened while the other pair of switching elements 62 and 63 are closed). A terminal of the switching element 64 receives a clock signal CLK, and a terminal of the switching element 64 receives an inverted clock signal /CLK. These clock signals CLK and /CLK are output when the switching elements 62 and 63 are closed. Operations of the shift register 21 according to an embodiment of the present invention having the aforementioned construction will now be described. Hereinafter, it is assumed that each shift circuit block SBn has two shift unit circuits.

Figure 6:
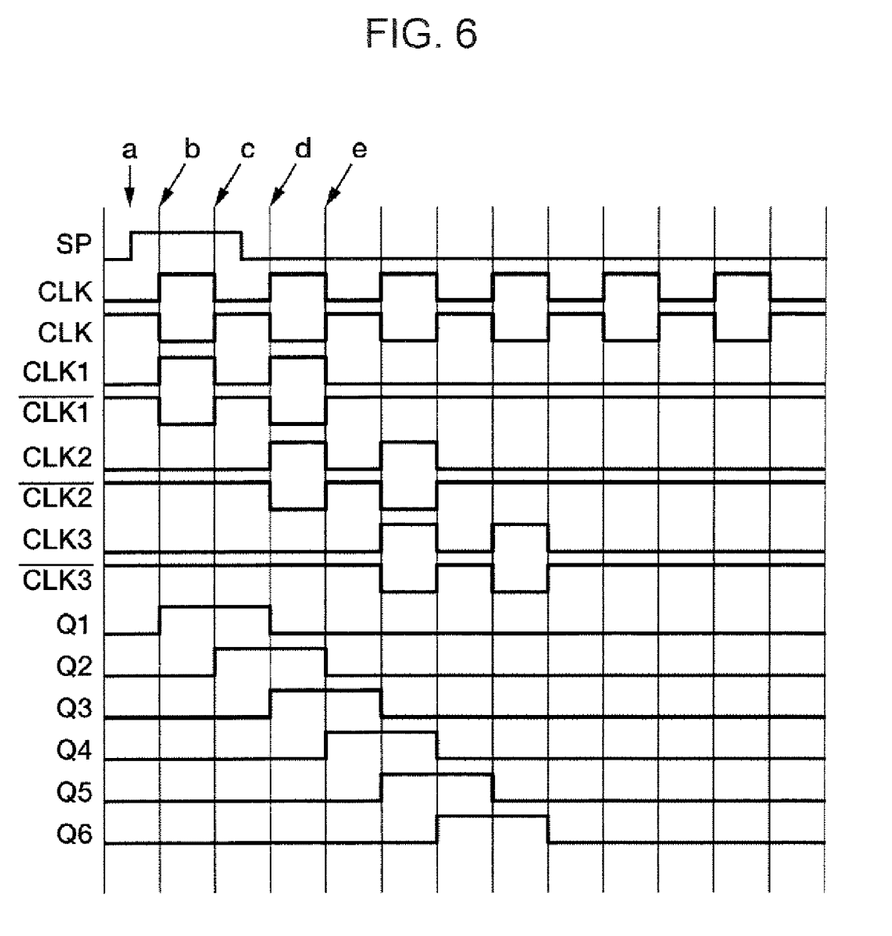
FIG. 6 is a timing chart for describing an operation of a scanning shift register.

FIG. 6 is a timing chart for describing operations of the shift register 21 according to an embodiment of the present invention.

In the time period a, when a start pulse SP having a high level is input, the start pulse SP is inverted to a low level by the inverter 50 (FIG. 2), and the inverted start pulse /SP is input to the multi-input NAND gate NAND included in the first shift circuit block SB1. Then, the multi-input NAND gate NAND is activated, and the output signal REFn having a high level is output. Accordingly, the clock gate of the clock control circuit CCC1 is opened. As a result, the clock signal CLK1 and the inverted clock signal /CLK1 are supplied to each shift unit circuit SU1 and SU2 included in the shift circuit block SB1.

In the time period b, when the clock signal CLK1 is initially changed to a high level after the clock signal CLK1 is supplied to the shift circuit block SB1, the start pulse SP is transmitted to the shift unit circuit SU1, so that its output signal Q1 is changed to a high level.

Subsequently, in the time period c, when the clock signal CLK1 is changed to a low level, the data of the shift unit circuit SU1 is transmitted to the shift unit circuit SU2, and its output signal Q2 is changed to a high level. Accordingly, the clock control circuit CCC2 of the next stage is activated, and the clock signal CLK2 is supplied to the shift circuit block SB2.

In the time period d, when the clock signal CLK1 is changed to a high level, the data of the shift unit circuit SU2 is transmitted to the shift unit circuit SU3 included in shift circuit block SB2 of the next stage, and its output signal Q3 is changed to a high level. At this moment, since the start pulse SP has a low level, the output signal Q1 of the shift unit circuit SU1 included in the first shift circuit block SB1 is changed to a low level.

Then, in the time period e when the clock is changed to a low level, the data of the shift unit circuit SU3 is transmitted to the shift unit circuit SU4, and its output signal Q4 is changed to a high level. Accordingly, the third clock control circuit CCC3 is activated, and the clock signal is supplied to the shift circuit block SB3. On the other hand, since the data having a low level is supplied from the shift unit circuit SU3 to the shift unit circuit SU2, the output signal Q2 of the shift unit circuit SU2 is changed to a low level. Accordingly, the multi-input NAND gate NAND included in the first shift circuit block SB1 is not activated, and the clock control circuit CCC1 stops supplying the clock signal CLK1.

Additionally, although it has been described that the start pulse SP is transmitted as the data signal in this embodiment, a data signal successively alternating between high and low levels may be transmitted. In this case, the clock signal CLK may be supplied only to a shift circuit block having a shift unit circuit of which the data signal has a high level.

Now, another embodiment of the present invention will be described. When the clock decision circuit determines whether or not the clock signal should be supplied, the output signal of the shift unit circuit may be used. In this case, a multi-input NOR gate is preferably used as the clock decision circuit. Hereinafter, this case will be described. Additionally, like reference numerals denote like elements and their descriptions will be appropriately omitted when descriptions are similar to those of the aforementioned embodiment.

Figure 7:
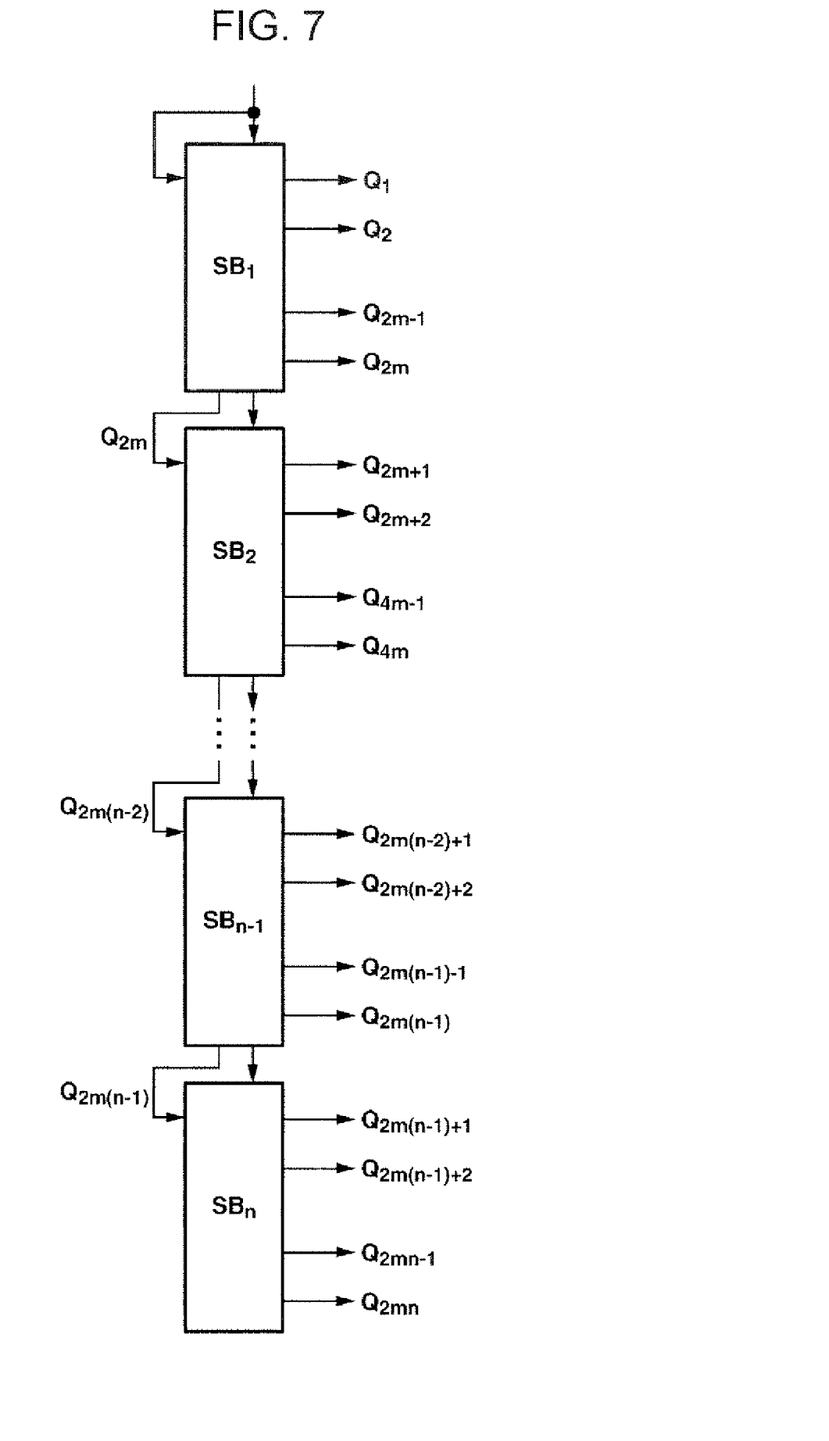
FIG. 7 is a block diagram illustrating a scanning shift register according to another embodiment of the present invention.

FIG. 7 is a block diagram illustrating a scanning shift resister 21 according to another embodiment of the present invention. The scanning shift register 21 shown in FIG. 7 is nearly the same as that shown in FIG. 2, but the inverter 50 is omitted.

Figure 8:
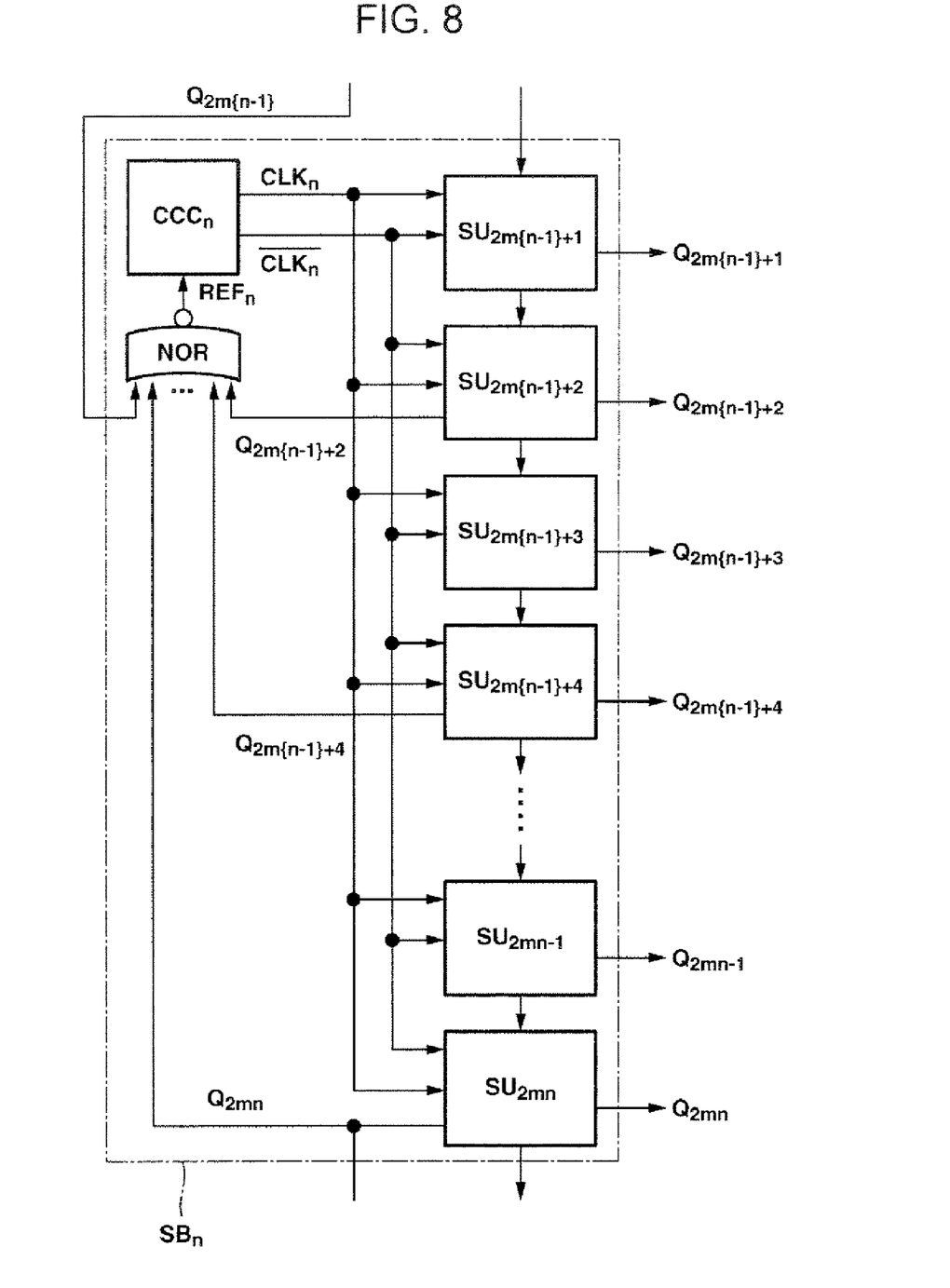
FIG. 8 is a block diagram illustrating each shift circuit block according to another embodiment of the present invention.

FIG. 8 is a block diagram illustrating a shift circuit block according to another embodiment of the present invention. Although a single shift circuit block SBn is representatively shown in detail in FIG. 8, other shift circuit blocks may have a similar construction. The shift circuit block SBn shown in FIG. 8 has a similar construction to that shown in FIG. 3, but a multi-input NOR gate NOR is used as a clock decision circuit.

Figure 9:
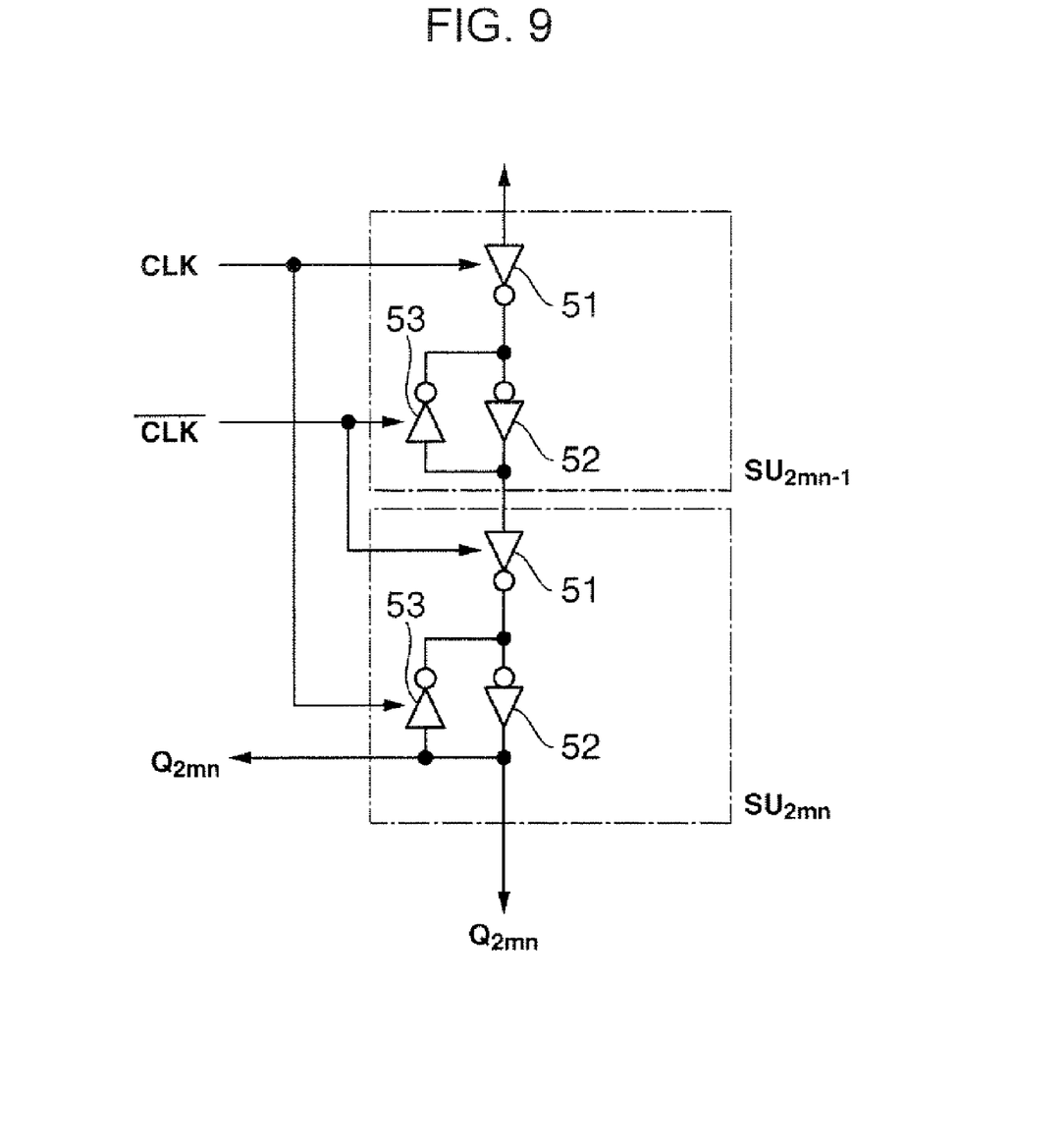
FIG. 9 is a circuit diagram illustrating a shift unit circuit according to another embodiment of the present invention.
Figure 10:
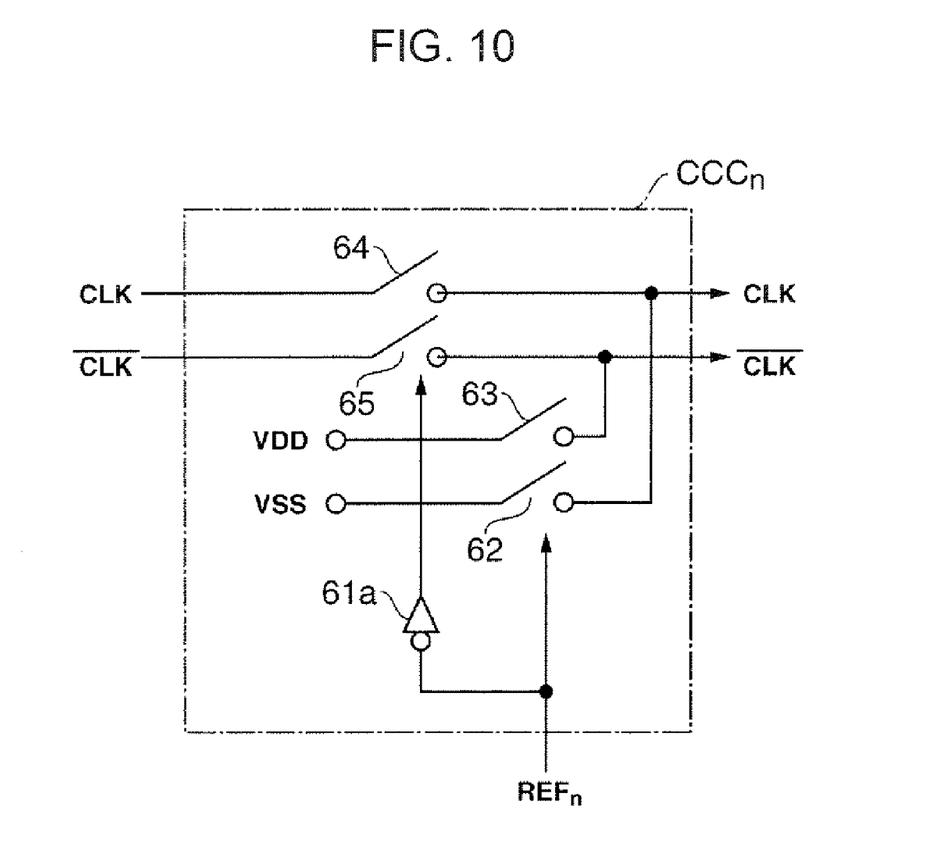
FIG. 10 is a circuit diagram illustrating a clock control circuit according to another embodiment of the present invention.

The clock control circuit CCCn controls the clocking of each shift unit circuit by referring to the output signal REFn from the multi-input NOR gate NOR. The multi-input NOR gate NOR receives internal condition signals from the even-numbered shift unit circuits included in the shift circuit block SBn corresponding to itself and an internal condition signal from the shift unit circuit provided in the last stage of the preceding shift circuit block SBn−1. When at least one of these internal condition signals has a high level (i.e., a first level), the output signal REFn (i.e., an operation allowance signal) having a low level is output. The multi-input NOR gate NOR functions as a decision circuit for determining whether or not the clock signal should be supplied. In FIG. 8, the multi-input NOR gate NOR receives the internal condition signals $Q_{2m[n-1]+2}$, $Q_{2m[n-1]+4}$, ... $Q_{2mn}$ from even-numbered shift unit circuits included in the shift circuit block SBn and the internal condition signal $Q_{2mn}$ from shift unit circuit $SU_{2mn}$ included in the last stage of the preceding shift circuit block SBn−1. When at least one of these internal condition signals has a high level, the output signal REFn of the multi-input NOR gate NOR is changed to a low level. At this moment, the clock control circuit CCCn which is activated by a low level signal supplies the clock signal CLKn and the inverted clock signal /CLKn to each shift unit circuit of the shift circuit block SBn. In addition, when all internal condition signals input to the multi-input NOR gate NOR from each shift unit circuit have a low level, the output signal REFn of the multi-input NOR gate NOR is changed to a high level. At this moment, the clock control circuit CCCn stops supplying the clock signal CLKn and the inverted clock signal /CLKn to each shift unit circuit of the shift circuit block SBn. FIG. 9 is a circuit diagram illustrating a shift unit circuit according to another embodiment of the present invention. The shift unit circuit shown in FIG. 9 has a similar construction to that shown in FIG. 5. In this embodiment, the output signals Q of the even-numbered shift unit circuits are supplied to the multi-input NOR gate NOR. FIG. 10 is a circuit diagram illustrating a clock control circuit according to another embodiment of the present invention. The clock control circuit CCCn shown in FIG. 10 has a similar construction to that shown in FIG. 5. In this embodiment, the inverter 61 is omitted, but an inverter 61a is added. Each switching element 62 and 63 is constructed of a circuit element such as a transistor, and opened/closed based on the output signal REFn from the multi-input NOR gate NOR. Each switching element 64 and 65 is constructed of a circuit element such as a transistor, and opened/closed based on the inverted output signal /REFn obtained by inverting the output signal REFn of the multi-input NOR gate NOR using the inverter 61a.

As described above, the shift register according to present invention may be achieved by using the multi-input NOR gate as a clock decision circuit. The operations of this case is similar to those when the multi-input NAND gate is used (refer to FIG. 6).

Figure 11A:
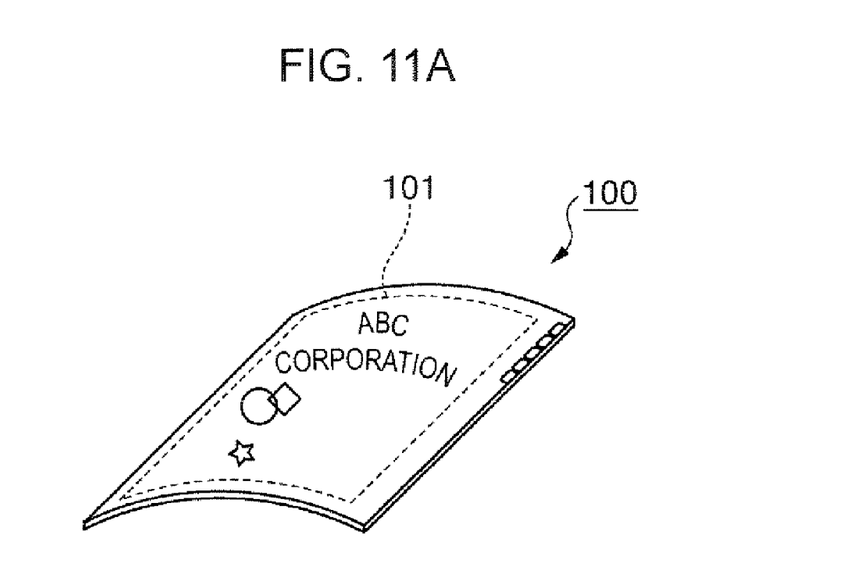
FIG. 11 is a perspective view illustrating an electronic device having an electrophoresis display device.
Figure 11B:
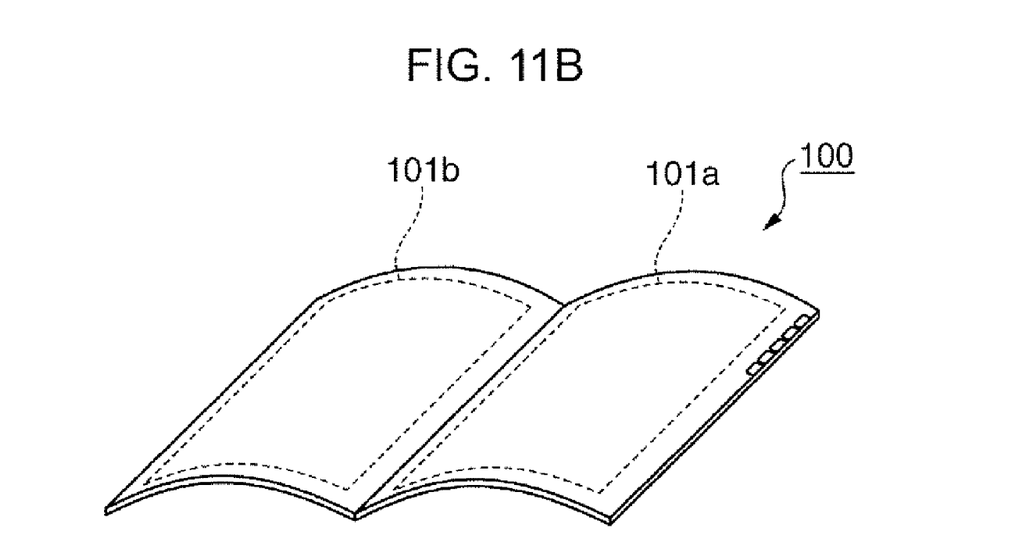

FIG. 11 is a perspective view illustrating an example of an electronic device including an electrophoresis display device according to an embodiment of the present invention. In this embodiment, an electronic paper is exemplified as an electronic device. Referring to FIG. 10A, the electronic paper 100 according to an embodiment of the present invention uses an electrophoresis display device 1 according to an embodiment of the present invention in the display unit 101. In addition, FIG. 10B is a perspective view illustrating a two-folded state of the electronic paper 100 according to an embodiment of the present invention. An electrophoresis display device according to an embodiment of the present invention is also used in the display units 101a and 101b. The electrophoresis display device according to an embodiment of the present invention may be used in a variety of electronic devices having a display unit, such as an IC card, and a PDA in addition to the aforementioned electronic paper.

According to the present invention, since the number of clock control circuits can be reduced in comparison with a conventional shift register circuit in which one clock control circuit should be provided for each shift unit circuit, it is possible to reduce a circuit size and power consumption. As a result, it is possible to implement a circuit layout having a narrow pitch, and apply the clock control circuit to a liquid crystal display panel having a high precision. In addition, according to the present invention, it is possible to accurately determine a shift circuit block to which the data should be transmitted to supply a clock signal thereto regardless of the timing or the number of transmission data. Therefore, it is possible to transmit even an input signal successively alternating between high and low levels, and obtain similar operations to those of a conventional shift register.

While the present invention has been particularly shown and described with reference to exemplary embodiments thereof, it will be understood by those skilled in the art that various changes and modifications may be made therein without departing from the spirit and scope of the invention as defined by the appended claims. Although an electrophoresis display device has been exemplified as a matrix type electronic device having a shift register (and a scanning line driving circuit using the same) according to the present invention in the aforementioned embodiments, the matrix type device according to the present invention is not limited thereto. For example, the matrix type electronic device according to the present invention may implemented in a variety of electro-optic display devices such as a liquid crystal display device and an electroluminescence display device or matrix type detection devices such as a fingerprint recognition sensor.

The entire disclosure of Japanese Patent Application No. 2005-241508, filed Aug. 23, 2005 is expressly incorporated by reference herein.

What is claimed is:

1. A shift register comprising:
    a plurality of shift circuit blocks connected in series, each of which includes a predetermined even-number of shift unit circuits;
    a plurality of clock decision circuit, each of which is provided for each of a plurality of the shift circuit blocks and receives internal condition signals from even-numbered shift unit circuits included in a corresponding shift circuit block and an internal condition signal from the last shift unit circuit included in a preceding shift circuit block, each of the clock decision circuit outputting an operation allowance signal when at least one of the internal condition signals has a first level; and
    a plurality of clock control circuits, each of which is provided for each of a plurality of the shift circuit blocks and performs a clock signal output operation when the operation allowance signal is supplied from a corresponding clock decision circuit commonly connected to another shift circuit block.

2. The shift register according to claim 1, wherein the clock decision circuit is a multi-input NAND gate, an output signal from each of the shift unit circuits is inverted, and the inverted output signal is input to the clock decision circuit as an internal condition signal.

3. The shift register according to claim 1, wherein the clock decision circuit is a multi-input NOR gate, and the output signal from the shift unit circuit is input as the internal condition signal.

4. A scanning line driving circuit comprising the shift register according to claim 1.

5. A matrix type device comprising the scanning line driving circuit according to claim 4.

6. An electro-optic device comprising the matrix type device according to claim 5.

7. An electronic device comprising the electro-optic device according to claim 6.

* * * * *